United States Patent
Box et al.

(10) Patent No.: US 7,274,431 B2
(45) Date of Patent: Sep. 25, 2007

(54) LITHOGRAPHIC PROJECTION APPARATUS AND DEVICE MANUFACTURING METHOD

(75) Inventors: Wilhelmus Josephus Box, Eksel (BE); Johannes Henricus Wilhelmus Jacobs, Eindhoven (NL); Paulus Martinus Maria Liebregts, Veldhoven (NL); Thijs Harink, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 476 days.

(21) Appl. No.: 10/875,510

(22) Filed: Jun. 25, 2004

(65) Prior Publication Data

US 2005/0018157 A1    Jan. 27, 2005

(30) Foreign Application Priority Data

Jun. 27, 2003    (EP) .................................. 03077015

(51) Int. Cl.
*G03B 27/52*    (2006.01)
*G03B 27/42*    (2006.01)
(52) U.S. Cl. ........................................ 355/30; 355/53
(58) Field of Classification Search ................. 355/30, 355/53, 67, 77; 250/548, 492.2; 356/399–401
See application file for complete search history.

(56) References Cited

U.S. PATENT DOCUMENTS 5,305,364 A * 4/1994 Mochiji et al. ............... 378/34
6,369,874 B1 * 4/2002 del Puerto .................... 355/30
6,549,264 B2 * 4/2003 Haney et al. ................. 355/30
6,714,278 B2 * 3/2004 Kamiya ....................... 355/30

FOREIGN PATENT DOCUMENTS

| EP | 0 532 968 A1 | 3/1993 |
| EP | 0 844 532 A2 | 5/1998 |
| EP | 0 844 532 A3 | 8/1999 |
| EP | 1 124 161 A2 | 8/2001 |
| EP | 1 178 357 A1 | 2/2002 |
| EP | 1 124 161 A3 | 1/2004 |

OTHER PUBLICATIONS

European Search Report dated May 13, 2004 for EP 03077015.0.

* cited by examiner

*Primary Examiner*—Henry Hung Nguyen
(74) *Attorney, Agent, or Firm*—Pillsbury Winthrop Shaw Pittman LLP (57) ABSTRACT

A lithographic projection apparatus is disclosed. The apparatus includes a substrate support for supporting at least one substrate, a radiation system for providing at least one beam of radiation, and a vacuum chamber. The vacuum chamber includes a patterning device and/or a projection system. The patterning device is arranged for patterning the beam of radiation according to a desired pattern, and the projection system is arranged for projecting the patterned beam of radiation onto a target portion of the substrate. The apparatus also includes at least one thermal shield for thermally conditioning at least part of the apparatus. The thermal shield includes particle transmission channels for transmitting particles through the shield, from a first side of the shield to a second side of the shield.

18 Claims, 3 Drawing Sheets

LITHOGRAPHIC PROJECTION APPARATUS AND DEVICE MANUFACTURING METHOD

CROSS-REFERENCE TO RELATED APPLICATIONS

This application claims the benefit of priority from European Patent Application No. 03077015.0, entitled "LITHOGRAPHIC PROJECTION APPARATUS AND DEVICE MANUFACTURING METHOD," filed Jun. 27, 2003, the content of which is incorporated herein by reference in its entirety.

FIELD

The invention relates to a lithographic projection apparatus and a device manufacturing method. More particularly, the invention relates to a thermal shield for thermally conditioning at least a part of the apparatus.

BACKGROUND

The term "patterning device" as here employed should be broadly interpreted as referring to a device that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such patterning devices include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing a piezoelectric actuation device. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic devices. In both of the situations described hereabove, the patterning device can include one or more programmable mirror arrays. More information on mirror arrays as here referred to can be gleaned, for example, from U.S. Pat. No. 5,296,891 and U.S. Pat. No. 5,523,193, and PCT patent applications WO 98/38597 and WO 98/33096, which are incorporated herein by reference. In the case of a programmable mirror array, the support structure may be embodied as a frame or table, for example, which may be fixed or movable as required; and A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper or step and repeat apparatus. In an alternative apparatus—commonly referred to as a step and scan apparatus—each target portion is irradiated by progressively scanning the mask pattern under the projection beam in a given reference direction (the "scanning" direction) while synchronously scanning the substrate table parallel or anti parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation sensitive material (resist). Prior to this imaging step, the substrate may undergo various procedures, such as priming, resist coating and a soft bake. After exposure, the substrate may be subjected to other procedures, such as a post exposure bake (PEB), development, a hard bake and measurement/inspection of the imaged features. This array of procedures is used as a basis to pattern an individual layer of a device, e.g. an IC. Such a patterned layer may then undergo various processes such as etching, ion implantation (doping), metallization, oxidation, chemo mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0 07 067250 4, incorporated herein by reference.

For the sake of simplicity, the projection system may hereinafter be referred to as the "lens"; however, this term should be broadly interpreted as encompassing various types of projection systems, including refractive optics, reflective optics, and catadioptric systems, for example. The radiation system may also include components operating according to any of these design types for directing, shaping or controlling the projection beam, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both incorporated herein by reference.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid crystal display panels, thin film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5-20 nm), as well as particle beams, such as ion beams or electron beams.

A lithographic projection apparatus is known from, for example, the European patent application EP 1 178 357 of the applicant, which is incorporated herein by reference. The known apparatus is specifically adapted for EUV (extreme ultraviolet) lithography, involving relatively short projection beam wavelengths for further device miniaturization. The known apparatus includes a radiation source, a projection optical system and a substrate stage. During use, the optical system transmits EUV radiation, generated by the radiation source, via a reticle onto the substrate for copying a reticle pattern onto the substrate. A reticle holder and the projection optical system are located in a vacuum chamber because of the use of an EUV projection beam.

The optics system of the known apparatus is provided with a temperature control member which at least partially surrounds one of the components in the vacuum chamber. This arrangement serves to keep the component substantially isothermal, on a desired temperature and/or on a stable temperature during operation.

Although the apparatus shown in EP 1 178 357 is functionally quite satisfactory, it still may be further improved. For example, the capacity of its vacuum pump has to be sufficient for maintaining the pressure of the vacuum chamber at a desired low level. It is desired to obtain a high degree of contamination removal from the vacuum chamber. Such contamination, for example water vapor and/or carbon containing compositions, will spread over the optics and/or reticle, making frequent cleaning treatments necessary and reducing the productivity of the apparatus.

SUMMARY

On aspect of the present invention is to improve the apparatus, particularly for achieving a relatively good vacuum for the patterning device and/or projection system or at least aims at providing a usable alternative to the projection apparatus known in the art.

According to the invention, this is achieved by providing a lithographic projection apparatus that includes a substrate support for supporting at least one substrate; a radiation system for providing at least one beam of radiation; a vacuum chamber including a patterning device and/or a projection system, wherein the patterning device is arranged for patterning the beam of radiation according to a desired pattern, wherein the projection system is arranged for projecting the patterned projection beam onto a target portion of the substrate; and at least one thermal shield for thermally conditioning at least part of the apparatus.

The thermal shield includes particle transmission channels for transmitting particles through the shield, from a first side of the shield to a second side thereof. In the present application, the word 'particle' should be understood as referring to at least an atomic or subatomic particle or any larger sized element, for example, a molecule and/or contamination particle. Because of the particle transmission channels, the thermal shield only forms a relatively small or substantially no barrier to particles, so that particles can travel through that thermal shield. Consequently, a relatively low pressure can be maintained in the vacuum chamber, providing a relatively clean environment for the patterning device and/or projection system. The thermal shield is preferably used to form a thermal barrier between different parts of the apparatus, for example to shield thermally sensitive parts from heat sources.

The transmission channels may be at least partly enclosed by a radiation absorbing surface. In that case, particles can be transmitted through the thermal shield whereas heat can be absorbed thereby in the transmission channels. Thus, the patterning device and/or projection system may be thermally well conditioned, whilst their environment can be maintained at a good vacuum, relatively free from contamination. To obtain a high degree of radiation absorption, the particle transmission channels are preferable optically opaque.

At least one vacuum pump may be provided for pumping particles being transmitted from the transmission channels. Such a pump can be located inside and/or outside the vacuum chamber. To obtain a high pumping speed and pumping efficiency, it is advantageous when the vacuum pump includes a cryopump, for example, a cryopanel, which is visible from the second side of the thermal shield. Then, particles, transmitted through the shield, can be captured substantially directly by the cryopump. The cryopump provides a relatively high vacuum at the second side of the shield, so that particles are transmitted substantially in one direction through the shield, towards the cryopump. The patterning device and/or projection system are then preferably at least partially located near and/or in sight of the first side of the thermal shield, so that they can be hardly reached by contaminating particles. On the other hand, contaminating and/or heat producing devices, for example actuators and such, are preferably located near the vacuum pump opposite the second side of the thermal shield. Then, contamination emanating from such devices can be captured by the vacuum pump. Furthermore, in that case, the thermal shield can also serve to absorb and/or reflect heat produced by such devices, before such heat reaches the patterning device and/or projection system.

According to an embodiment, the cryopump is located substantially between the thermal shield and a vacuum chamber wall having a relatively low emissivity, particularly an emissivity $\epsilon$ of 0.5 or less. The vacuum chamber wall may serve to shield the vacuum chamber content from outside radiation. Because of the location of the cryopump, substantially small particle travel paths may exist within the vacuum chamber, so that a relatively high vacuum may be maintained therein. The utilization of at least one cryopump within the vacuum chamber wall may make the use of relatively expensive high capacity vacuum pumps superfluous. Further, the apparatus may be made relatively compact using cryopumps.

According to an embodiment, a lithographic projection apparatus is provided. The apparatus includes an illuminator for conditioning a beam of radiation, a patterning device for patterning the beam of radiation according to a desired pattern, a substrate support for supporting at least one substrate, a projection system for projecting the patterned beam of radiation onto a target portion of the substrate, a vacuum chamber for housing the patterning device and/or the projection system, and at least one thermal shield for thermally conditioning the patterning device and/or the projection system disposed in the vacuum chamber. The shield includes particle transmission channels for transmitting particles through the shield, from a first side of the shield to a second side of the shield.

According to an aspect of the invention, there is provided a device manufacturing method. The method includes providing a beam of radiation using a radiation system, patterning the beam of radiation with a patterning device, and projecting the patterned beam of radiation with a projection system onto a target portion of a layer of radiation-sensitive material on a substrate. The patterning device and/or the projection system is provided in a vacuum environment. A temperature of at least part of the patterning device and/or the projection system is thermally conditioned by a thermal shield. The thermal shield includes particle transmission channels. Particles are transmitted through the shield via the channels away from the radiation system, the patterning device, the substrate, and/or the projection system.

In an embodiment, the device manufacturing method includes patterning a beam of radiation with a patterning device, projecting the patterned beam of radiation with a projection system onto a target portion of a layer of radiation-sensitive material on a substrate, generating a vacuum environment in a vacuum chamber that houses the patterning device and/or the projection system, and thermally conditioning the patterning device and/or the projection system with a thermal shield. Particles are transmitted away from the patterning device, the projection system, the substrate, or any combination thereof through particle transmission channels in the shield.

Thus, particle build up on or near the patterning device and/or projection system may be prevented during the fabrication of devices. Consequently, the method can produce devices having small design rules, with high precision.

Additional embodiments are described in detail below.

BRIEF DESCRIPTION OF THE DRAWINGS

Further advantageous embodiments are described in the dependent claims. Embodiments of the invention will now be described, by way of example only, with reference to the accompanying schematic drawings in which corresponding reference symbols indicate corresponding parts, and in which:

DETAILED DESCRIPTION

Figure 1:
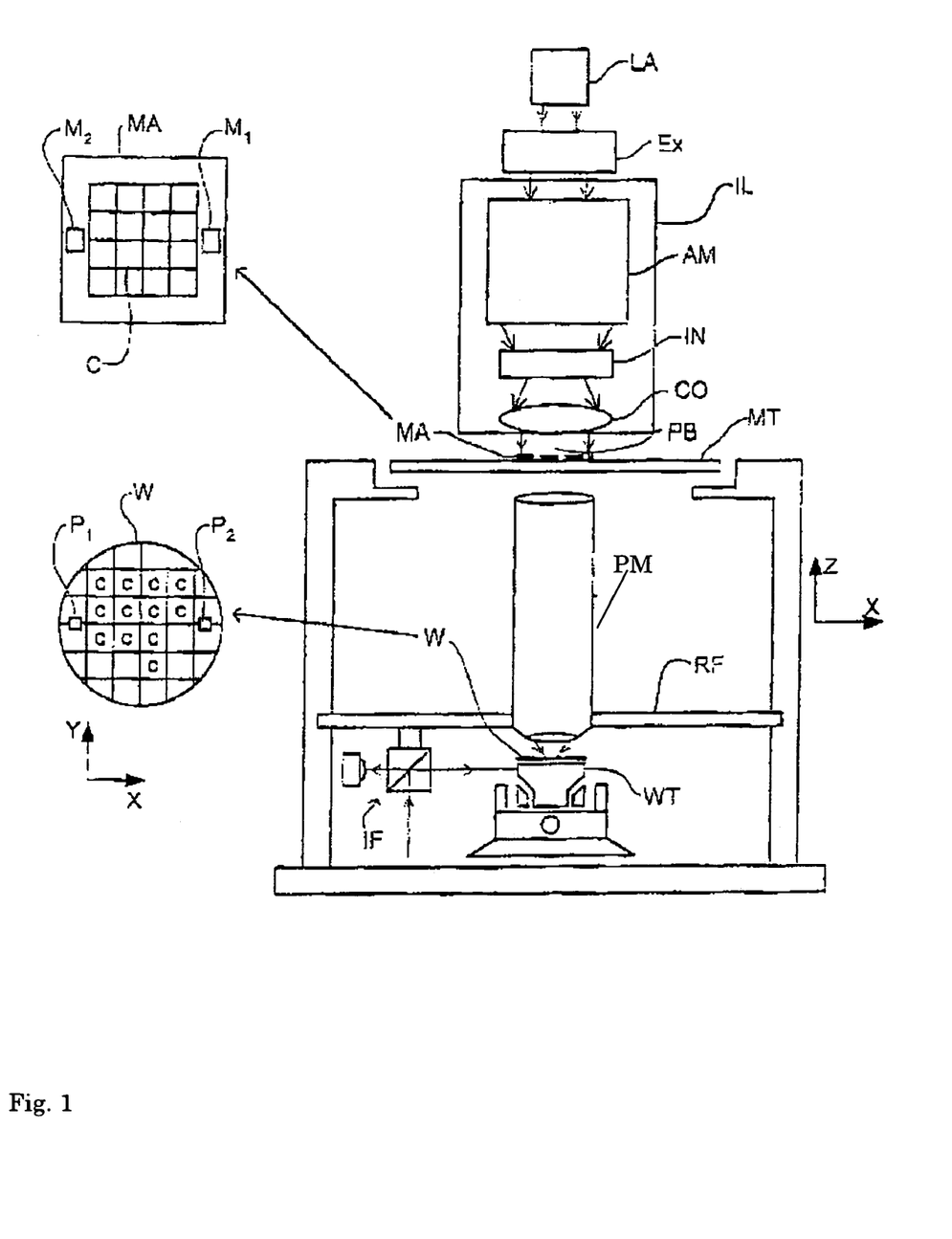
FIG. 1 depicts an example of a lithographic projection apparatus.

FIG. 1 schematically depicts an example of a lithographic projection apparatus. The apparatus includes: a radiation system Ex, IL, for supplying a projection beam PB of radiation (e.g. light in the deep ultraviolet region). In this particular case, the radiation system also includes a radiation source LA. A first object table (mask table) MT is provided with a mask holder for holding a mask MA (e.g. a reticle), and is connected to a first positioning device for accurately positioning the mask with respect to item PM. A second object table (substrate table) WT is provided with a substrate holder for holding a substrate W (e.g. a resist coated silicon wafer), and is connected to a second positioning device for accurately positioning the substrate with respect to item PM. A projection system ("lens") PM for imaging an irradiated portion of the mask MA onto a target portion C (e.g. comprising one or more dies) of the substrate W is also provided. The term substrate table as used herein can also be considered or termed as a substrate support. It should be understood the term substrate table broadly refers to a structure that supports, holds, or carries a substrate.

As here depicted, the apparatus is of a transmissive type (i.e. has a transmissive mask). However, in general, it may also be of a reflective type, for example, with a reflective mask. Alternatively, the apparatus may employ another kind of patterning device, such as a programmable mirror array of a type as referred to above.

The source LA (e.g. an excimer laser source) produces a beam of radiation. This beam is fed into an Illumination system (illuminator) IL, either directly or after having traversed a conditioning device, such as a beam expander Ex, for example. The illuminator IL may include an adjusting device AM for setting the outer and/or inner radial extent (commonly referred to as σ-outer and σ-inner, respectively) of the intensity distribution in the beam. In addition, it will generally include various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PM, which focuses the beam PB onto a target portion C of the substrate W. With the aid of the second positioning device (and an interferometric measuring device IF), the substrate table WT can be moved accurately, e.g. so as to position different target portions C in the path of the beam PB. Similarly, the first positioning device can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:

1. In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB; and 2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PM (typically, M=¼ or ⅕). In this manner, a relatively large target portion C can be exposed, without having to compromise on resolution.

Figure 2:
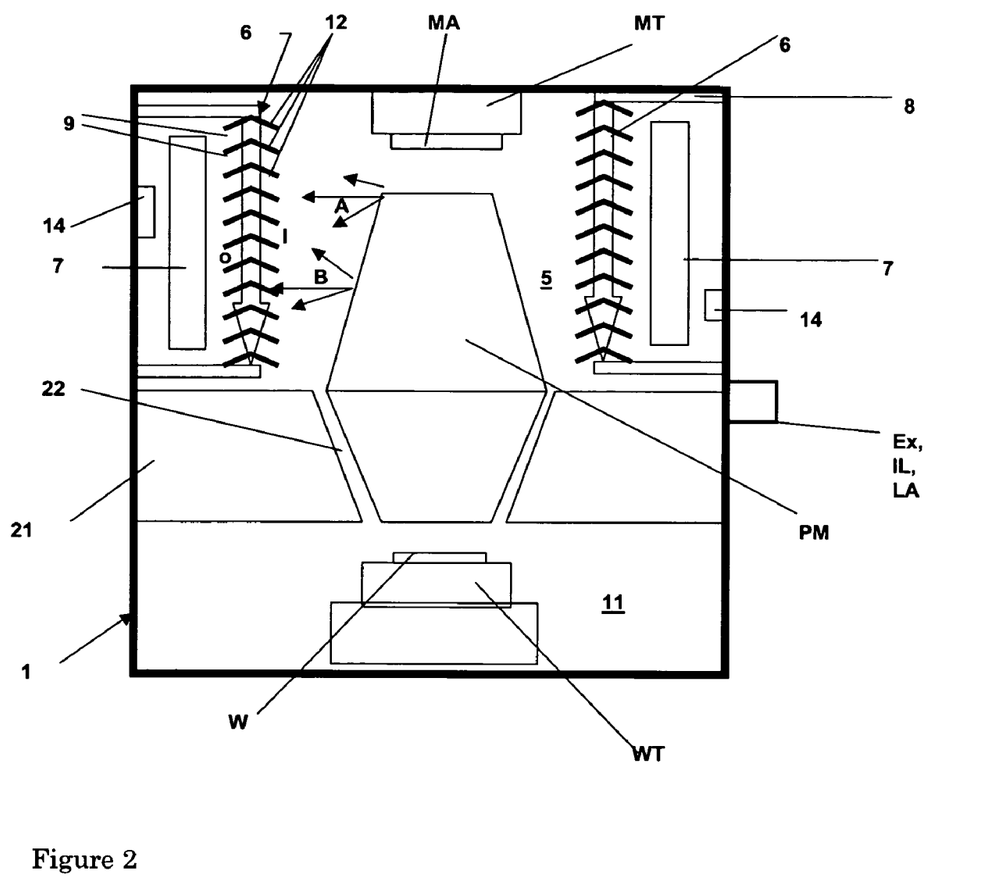
FIG. 2 shows a lithographic projection apparatus according to an embodiment of the invention.

FIG. 2 schematically depicts a lithographic projection apparatus according to an embodiment of the invention, including: a radiation system Ex, IL, LA for providing at least one projection beam of radiation; a first vacuum chamber 5 including a patterning device MT, MA and a projection system, or projection device PM; and a second vacuum chamber 11 including a substrate holder WT, holding a substrate W during use.

The radiation system Ex, IL, LA is located outside the first vacuum chamber 5. Preferably, the radiation system Ex, IL, LA is arranged to generate an EUV projection beam. Such a radiation beam generally has a wavelength λ of less then about 20 nm. However, the radiation beam can also have other wavelengths, for example, X-ray wave lengths or wavelengths above 20 nm. Means for directing the projection beam towards the patterning device MT, MA are not shown in the Figure.

The patterning device MT, MA is arranged for patterning the projection beam according to a desired pattern. The patterning device includes a reticle table MT, for holding a reticle MA during use. The reticle table MT is coupled to a vacuum chamber wall 1 of the apparatus. The vacuum chamber wall 1 has a low emissivity to shield the first and second vacuum chamber 5, 11 from environmental radiation, for example, an emissivity $\epsilon$ of less than 0.5, more specifically less than 0.1. Consequently, outside heat fluctuations have substantially no or only little influence on the temperature in the first and second vacuum chamber.

The projection system PM is arranged for projecting the patterned projection beam onto a target portion of the substrate W. To this aim, the projection system includes a projection optics box PM that includes optical elements, for example, mirrors, for scaling and redirecting the radiation beam. The projection optics box PM is mounted on a metro frame 21, such that the optics box PM is substantially mechanically decoupled from the chamber wall 1. This mechanical decoupling is schematically depicted in FIG. 2 by a slit 22 extending between the metro frame 21 and the optics box PM. In practice, however, this slit 22 is sealed to prevent contamination, emanating from the second vacuum chamber 11, to reach the first vacuum chamber 5. Consequently, the first vacuum chamber 5 is substantially sealed from the second vacuum chamber 11 by the metro frame 21 and the optics box PM. The optical elements and the metro frame usually contain low expansion materials, for example, ZERODUR™ or INVAR™. Note, that the metro frame 21 is preferably also mechanically decoupled from the vacuum chamber wall 1 by a similar slit. However, such a slit is not shown in FIG. 2.

During use, the substrate W is at least partially covered by a layer of radiation sensitive material. A projection beam of radiation is provided, using the radiation system. First, the projection beam is endowed with a pattern in its cross-section, using the reticle MA held by the reticle table MT. Then, the patterned beam is projected onto a target portion of the substrate W by the optics contained in the projection optics box PM, such that at least part of the radiation sensitive material is illuminated. An advantage of the shown apparatus is that the substrate table WT is located in the second vacuum chamber 11, which is substantially separated from the first vacuum chamber 5. Consequently, the environment of the patterning device MT and of the optics of the projection system PM can be kept substantially free from contamination which may be carried by the substrate W and/or the substrate table WT. The apparatus provides for an in-line processing of a large number of substrates W.

As is shown in FIG. 2, the apparatus of the present embodiment includes two cryopanels 7 for maintaining the first vacuum chamber 5 at a desired low pressure. Vacuum pumps for maintaining the second vacuum chamber are not shown, but may, for example, also include one or more such cryo-elements. The apparatus includes two thermally conditioned shields 6 to provide a thermal conditioning of at least part of the patterning device MT, MA and the projection system PM. Each shield 6 faces the reticle stage MT and the projection optics box PM with a first shield side I. The second sides O of the shields 6, directed away from the respective first shield side I, face the cryopanels 7. Consequently, the two thermal shields 6 substantially shield the two cryopanels 7 from the patterning device MT, MA and the projection optics box PM. Each thermal shield 6 is thermally conditioned by a heating and/or cooling device, which include fluid carrying ducts 8, for maintaining the thermal shield 6 at a certain conditioning temperature. It is clear, that the thermal conditioning of the thermal shields 6 can be achieved by various other devices, such as electrical heaters, heat pipes, peltier elements, and a combination of these or other devices. The thermal shields as such may have a certain electrical resistance, which can also be used as an electrical heating device.

Each thermal shield 6 includes particle transmission passages 9 for transmitting particles from the first side I of the shield to the second side O thereof. The cryopanels 7 can capture particles that originate from the environment of the patterning device MT, MA and the projection optics box PM. The cryopumps 7 are positioned in the first vacuum chamber 5, particularly near the optics box PM, so that relatively short travel paths exist in the vacuum chamber 5, 11. Thus, a desired high vacuum can be achieved in the first vacuum chamber 5.

Contamination of the patterning device MT, MA and the optics box PM can be further prevented by the transmission of particles through the thermal shields 6 towards the cryopanels 7, so that the apparatus can have a high availability and long up-times between cleaning stages. Furthermore, the apparatus can be pumped down to operating pressure relatively fast by the cryopanels. The usually expensive projection optics can retain long lifetimes. Preferably, the projection optics box PM has a relatively open structure with open side walls, no side walls or perforated side walls, so that optical elements contained therein are in direct view with one or more of the particle transmission passages 9. During use, the cryopumps 7 are kept at a suitable, relatively low temperature, for example, 130 K or 77 K, to provide a sufficient pumping capacity in the first vacuum chamber 5.

The reticle stage MT, MA and the projection optics box PM are preferably not in direct optical view of the cryopanels 7, to avoid that they are cooled by the cryopanels 7 via heat radiating. According to the invention, this is achieved when the transmission channels 9 of the thermal shields 6 are arranged to be optically opaque. Therefore, the patterning device MT, MA and projection system PM can be maintained at a desired operating temperature, substantially independent of the temperature of the cryopanels 7, while particles can be transmitted through the thermal shields 6 towards the cryopanels 7. The metro frame 21 is preferably also shielded from the cryopanels 7 to prevent an undesired cooling and temperature fluctuations of the metro frame 21.

A thermal conditioning of the patterning device MT, MA and the particle optics box PM is achieved, by providing the thermal shields 6 with radiation absorbing surfaces, the surfaces particularly having a radiation emissivity $\epsilon_r$ of at least 0.5, preferably at least 0.9. Firstly, the thermal shields 6 provide stable temperature references in the first vacuum chamber 5, capable of removing excessive and/or fluctuating heat loads from the patterning device PM and reticle device MT, MA. Such heat loads may, for example, be emanating from certain heat sources present in or near the first chamber 5, such as actuators 14. Heat sources, such as the actuators 14, are preferably shielded from the patterning device MT, MA and projection system PM by the thermal shields 6. Such heat sources are advantageously located at the side of the cryopanel 7 which is directed away from the respective thermal shield 6, as is shown in FIG. 2. Heat, produced by these heat sources 14 and/or projection beam light, can then be absorbed by the respective cryopanel 7 and/or thermal shield 6. Such heat is therefore prevented from reaching the patterning device MT, MA and the optics box PM of the first vacuum chamber 5. The removal of such actuator heat loads and/or projection beam heat loads from the vacuum chamber 5 can be regarded as an indirect thermal conditioning of the patterning device MT, MA and the projection system PM.

Secondly, the optics, reticle device MT, MA and/or substrate stage WT can lose heat to the thermal shields 6 by heat radiating, in case the temperature of the optics and/or reticle device is higher than the temperature of the thermal shields 6. Consequently, the thermal shields 6 also provide a direct thermal conditioning of the optics and the patterning device MT, MA. Heating up of the reticle device, optics, substrate W and substrate holder WT is possible, for example, under influence of the irradiating of the projection beam light. For the case in which the thermal shields 6 can only partially provide a thermal conditioning of the patterning device and/or optics, further heating and/or cooling devices can be applied, for example heat pipes, electric devices, peltier elements, heating/cooling fluid and a combination of these or other devices. Preferably, the thermal shield 6 is mechanically decoupled from at least the projection system PM and the metro frame, so that vibrations of the thermal shield 6 are substantially not passed to the projection system PM.

Figure 3:
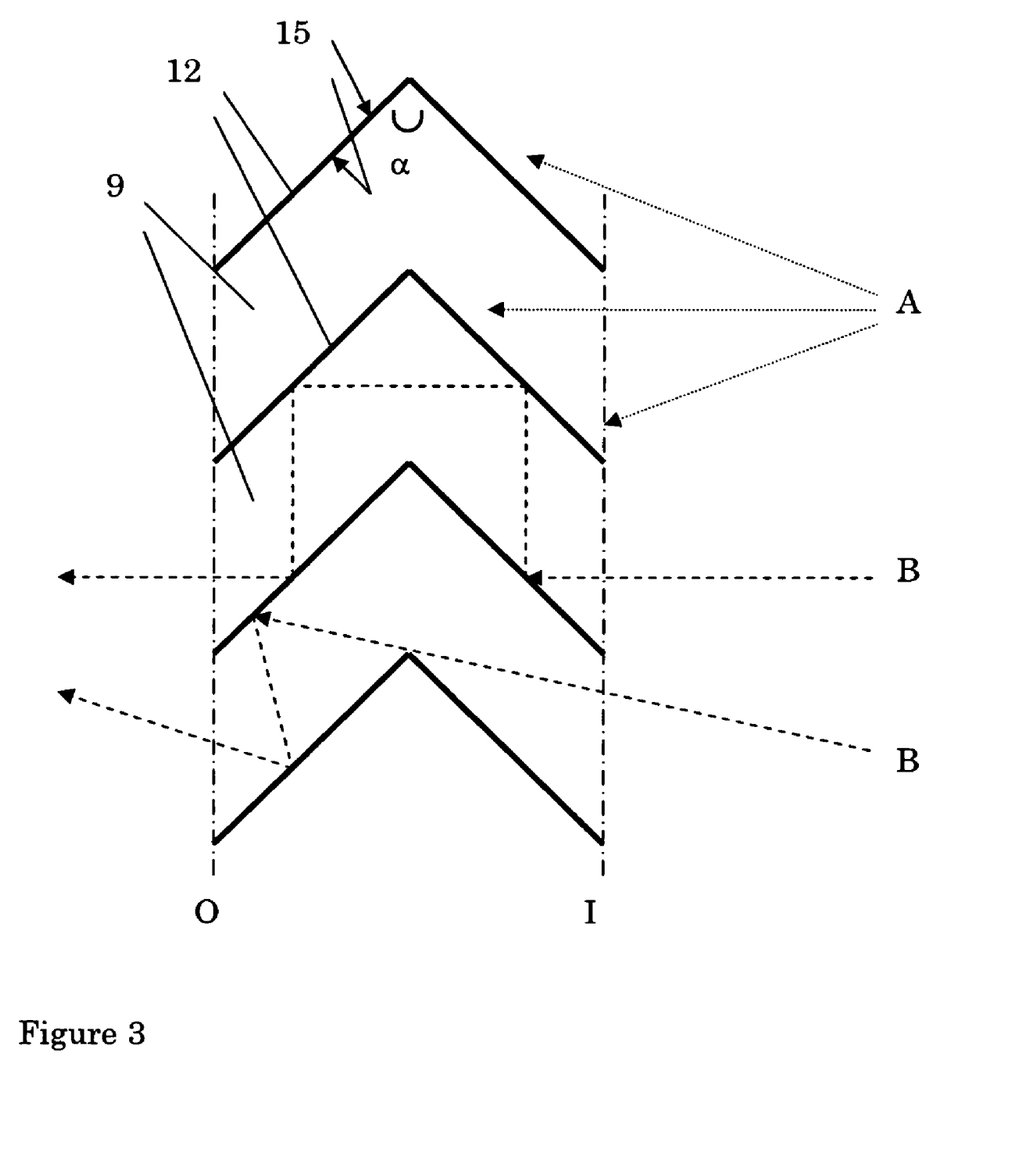
FIG. 3 shows a detail of a thermal shield of the apparatus of FIG. 2.

FIG. 3 shows a thermal shield 6 in more detail. The shield 6 includes substantially parallel, spaced-apart strips 12 which enclose the particle transmission channels 9 between opposite strip surfaces 15. The surfaces 15 of the strips are radiation absorbing. The strips 12 may be provided, for example, by one or more radiation absorbing coatings. The heating and/or cooling devices 8 are not shown in FIG. 3. The thermal shield strips 12 preferably have a relatively high heat conduction coefficient for a desired heat transfer to/from the heating and/or cooling devices 8. In the present embodiment, the strips 12 have substantially chevron-like cross-sections. The strips 12 overlap with one another, so that the shield 6 is opaque when viewed sideways, parallel to the plane of the drawing. In FIG. 3, the two flanges of each strip 12 enclose a top angle $\alpha$ of about 90°. However, a smaller or larger top angle may be also be used. An advantageous top angle, providing a large particle transmissivity, is in the range of about 110-130°, more particularly about 120°.

Inbound radiation, indicated in FIG. 3 by arrows A, is substantially absorbed by the thermal shield strips 12. However, inbound particles, indicated by arrows B, will be transmitted via the transmission channels 9 from the first shield side I towards the second shield side O, particularly by bouncing one or more times between neighboring strips 12. Consequently, each thermal shield 6 can absorb radiation while transmitting particles. Many sorts of particle may be transmitted through the transmission channels 9 in this manner, for example atoms, molecules or any large particles, inert gasses, the residue in a purge gas, water vapor, carbon-dioxide and such. The strips 12 preferably have relatively smooth, non-porous, and/or polished surfaces 15 to provide a high particle reflection ratio. Preferably, the reflection ratio of the strip surface 15 is at least 0.5, so that at least half of inbound particles are reflected by that surface 15. Because of the transmission channels 9, particles can pass though the thermal shields 6 and be absorbed by the cryopanels 7, so that the vacuum chamber 5 can be kept relatively clean and at a relatively high vacuum. At the same time, the thermal shields 6 provide a direct and indirect thermal conditioning of at least the patterning device MT, MA and the projection system PM, so that a high precision lithography can be realized, for example using EUV.

While specific embodiments of the invention have been described above, it will be appreciated that the invention may be practiced otherwise than as described. The description is not intended to limit the invention.

For example, the apparatus may include one or more vacuum pumps. Further, the apparatus may include several types of vacuum pumping devices for maintaining the vacuum chambers at desired low pressures, for example cryopumps, turbo molecular pumps and/or the like. The pumping devices can be arranged for removing condensing and/or non-condensing substances. The vacuum pumping devices can be located inside the respective vacuum chamber and/or outside.

Different temperature conditioning devices may be provided for conditioning the temperatures of various parts of the apparatus. Temperature conditioning can, for example, be obtained via heat conduction, convection, radiation and/ or heat dissipation. The conditioning devices can be arranged to control the temperature of the projection optics box, optical elements, the reticle and/or reticle table, the metro frame, an illuminator frame, the substrate and/or substrate holder and such.

The radiation absorbing coating may include, for example, a suitable metal and/or semiconductor oxide layer, a ceramic coating, a black paint, or other suitable materials and/or coatings.

The apparatus may include at least one reticle table for holding at least one reticle.

The apparatus may include at least one vacuum chamber, for example, one vacuum substrate chamber, one vacuum chamber including the projection box, and one vacuum chamber including the patterning device.

The thermal shield 6 and/or cryopump 7 can be provided in different shapes and made from different materials. The thermal shield 6 and/or cryopump 7 may be, for example, substantially straight, curved, cylindrical or such. One or more parts of the apparatus, for example, the wafer stage, particle optics box and/or reticle, may, for example, be partially or substantially surrounded by the thermal shield 6 and/or cryopump 7.

Further, the cryopump 7 may include an integrated heating and/or cooling device, for example, for maintaining the cryopump 7 at a desired temperature and/or for defrosting the pump 7, if desired.

The strips 12 of the thermal shield 6 may have different forms and cross-sections, for example, chevron, curved, or other suitable shapes. Several rows of strips or several thermal shields may be positioned in parallel next to each other. Each strip may include, for example, a profile of one or more flanges.

The radiation absorbing surface of the thermal conditioning device can be provided in different locations, for example, on the projection optics box PM, on the inside of the chamber wall 1 and/or in other places.

Furthermore, the thermal shield 6 can at least partly include a radiation absorbing surface for absorbing heat radiation. Such a thermal shield may, for example, thermally shield different parts of the apparatus from each other by heat reflection and/or heat absorption.

The cryopump 7 can be located at different positions in the vacuum chamber 5, for example, between a thermal shield 6 and a vacuum chamber wall 1. The cryopump 7 can be substantially surrounded by one or more thermal shields 6. The cryopump 7 may also be located at a certain distance from the vacuum chamber wall 1, for example, substantially centrally within the vacuum chamber 5. The cryopanel 7 and/or thermal shield 6 may be provided in sight of the radiation system Ex, IL, LA, for example to keep the radiation source at a desired vacuum level.

Furthermore, the second vacuum chamber 11 may be provided with a vacuum pumping device, for example, at least one cryo-element 7, and/or a thermal shield, for example, surrounding the wafer stage WT. In that way, a good vacuum can be achieved in the second vacuum chamber 11, so that the wafer can be kept relatively clean.

It is also understood that the lithographic projection apparatus can be arranged for several projection processes, for example EUV projection, X-ray projection, e-beam writing and such.

While specific embodiments of the invention have been described above, it will be appreciated that the invention may be practiced otherwise than as described. The description is not intended to limit the invention.

What is claimed is:

1. A lithographic projection apparatus, comprising:
   a substrate support for supporting at least one substrate;
   a radiation system for providing at least one beam of radiation;
   a vacuum chamber comprising a patterning device and/or a projection system, wherein said patterning device is arranged for patterning the beam of radiation according to a desired pattern, wherein said projection system is arranged for projecting said patterned beam of radiation onto a target portion of said substrate; and
   at least one thermal shield for thermally conditioning at least part of the apparatus, wherein said thermal shield comprises particle transmission channels for transmitting particles through the shield, from a first side of the shield to a second side thereof.

2. An apparatus according to claim 1, further comprising a vacuum pumping device, wherein the vacuum pumping device is visible from said second side of said thermal shield for pumping particles from said transmission channels.

3. An apparatus according to claim 2, wherein said pumping device comprises at least one cryopump.

4. An apparatus according to claim 2, wherein said pumping device is located substantially between said thermal shield and a wall of said vacuum chamber, said vacuum chamber wall having an emissivity $\epsilon$ of about 0.5 or less.

5. An apparatus according to claim 4, wherein said vacuum chamber wall has an emissivity $\epsilon$ of about 0.1 or less.

6. An apparatus according to claim 1, wherein said transmission channels of said thermal shield are arranged to be substantially optically opaque.

7. An apparatus according to claim 1, wherein said thermal shield comprises substantially parallel strips, wherein said strips substantially enclose said transmission channels.

8. An apparatus according to claim 7, wherein said strips have chevron-like cross-sections.

9. An apparatus according to claim 1, wherein at least part of said radiation system, said patterning device, said substrate holder, and/or said projection system is substantially visible from said first side of thermal shield.

10. An apparatus according to claim 1, wherein said thermal shield is at least partially provided with a radiation absorbing surface.

11. An apparatus according to claim 10, wherein said transmission channels are at least partly enclosed by said radiation absorbing surface.

12. An apparatus according to claim 1, wherein said thermal shield comprises a heating and/or cooling device for maintaining said thermal shield at a certain conditioning temperature.

13. A lithographic projection apparatus comprising:
    an illuminator for conditioning a beam of radiation;
    a patterning device for patterning the beam of radiation according to a desired pattern;
    a substrate support for supporting at least one substrate;
    a projection system for projecting the patterned beam of radiation onto a target portion of the substrate;
    a vacuum chamber for housing the patterning device and/or the projection system; and
    at least one thermal shield for thermally conditioning the patterning device and/or the projection system disposed in the vacuum chamber,
    wherein the shield comprises particle transmission channels for transmitting particles through the shield, from a first side of the shield to a second side of the shield.

14. A device manufacturing method comprising:
providing a beam of radiation using a radiation system;
patterning the beam of radiation with a patterning device; and
projecting the patterned beam of radiation with a projection system onto a target portion of a layer of radiation-sensitive material on a substrate,
wherein said patterning device and/or said projection system is provided in a vacuum environment, wherein the temperature of at least part of said patterning device and/or said projection system is thermally conditioned by a thermal shield, wherein said thermal shield comprises particle transmission channels, and wherein particles are transmitted through the shield via said channels away from said radiation system, said patterning device, said substrate, and/or said projection system.

15. A device manufacturing method comprising:
patterning a beam of radiation with a patterning device;
projecting the patterned beam of radiation with a projection system onto a target portion of a layer of radiation-sensitive material on a substrate;
generating a vacuum environment in a vacuum chamber that houses the patterning device and/or the projection system; and
thermally conditioning the patterning device and/or the projection system with a thermal shield, wherein particles are transmitted away from the patterning device, the projection system, the substrate, or any combination thereof through particle transmission channels in the shield.

16. An apparatus according to claim 1, wherein said thermal shield is constructed and arranged to provide a thermal barrier to different parts of the apparatus.

17. An apparatus according to claim 16, wherein the thermal shield is constructed and arranged to shield thermally sensitive parts of the apparatus from heat sources.

18. An apparatus according to claim 13, wherein the thermal shield is constructed and arranged to maintain the patterning device and/or the projection system at a desired operating temperature.

* * * * *